Figure 1:
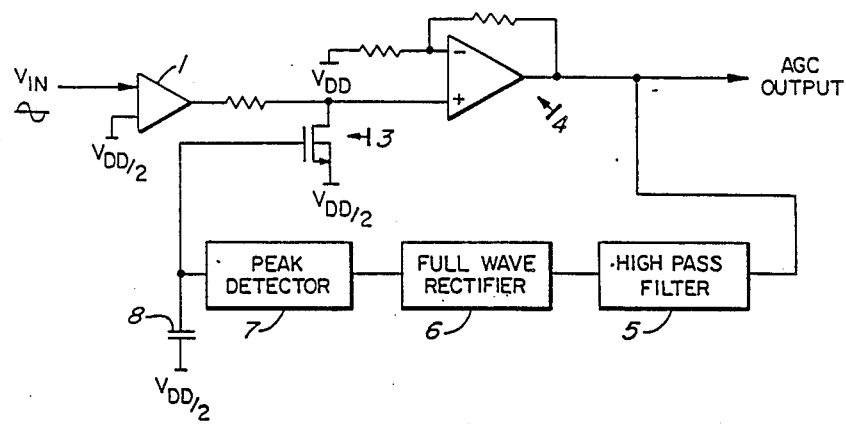

United States Patent [19]

Dea et al.

[11] Patent Number: 4,933,647
[45] Date of Patent: Jun. 12, 1990

[54] AGC CIRCUIT

[75] Inventors: Frank Y. Dea, Nepean; Tam Nguyen, Ottawa, both of Canada

[73] Assignee: Mitel Corporation, Ontario, Canada

[21] Appl. No.: 348,777

[22] Filed: May 8, 1989

[30] Foreign Application Priority Data

Nov. 18, 1988 [CA] Canada .................................. 583435

[51] Int. Cl.⁵ .............................................. H03G 3/30
[52] U.S. Cl. .................................................. 330/284
[58] Field of Search ................. 330/145, 284; 455/249

[56] References Cited

FOREIGN PATENT DOCUMENTS 696592 11/1979 U.S.S.R. ............................. 330/284

*Primary Examiner*—James B. Mullins
*Attorney, Agent, or Firm*—Antonelli, Terry, Stout & Kraus

[57] ABSTRACT

A linear automatic gain control circuit which can be entirely fabricated in an integrated circuit. A voltage divider has a fixed leg and a variable leg connected in series across a signal input. A non-inverting operational amplifier connected between the voltage divider and an output terminal. The variable leg is comprised of a MOSFET transistor having its source connected to the fixed leg. The junction of the source and the fixed leg carries a d.c. voltage applied from the input. A fixed operating voltage is applied to the drain of the transistor which is equal to the d.c. voltage. Signal peaks from the output of the operational amplifier are detected which are in the same polarity sense as the operating voltage. The signal peaks are stored in a storage means having a predetermined time constant. The stored signal peaks are applied to the gate of the transistor, whereby the transistor is enabled to conduct an input signal in the voltage divider symmetrically in both positive and negative directions. No external capacitor is required.

24 Claims, 3 Drawing Sheets

AGC CIRCUIT

This invention relates to signal transmission apparatus and particularly to an integrated circuit linear automatic gain control.

Automatic gain control (AGC) circuits for use with, for example, modems, and in particular for controlling DTMF signals, could previously not be entirely fabricated in an integrated circuit, because the time constant of a controlling voltage retention circuit in a feedback loop required a capacitor that was so large that it could not be integrated into a semi-conductor chip. In addition, such prior art AGC control circuits distorted the signal controlled thereby to a certain extent. While the distortion has not been of major concern in the past, improved transmission systems which require highly faithful transmission of data which could not tolerate the distortion introduced by such AGC circuits.

In addition, prior art AGC circuits required loop gain and thus amplification in the feedback loop to generate adequate control voltage to ensure the most symmetrical conduction of the control transistor in both positive and negative direction of swing of the input signal. This required the use of substantial integrated circuit substrate area, and is thus costly.

The present invention avoids the use of amplifiers in the AGC control loop, thus significantly reducing the semiconductor substrate area that is required. Further, the invention automatic gain controls an input signal while maintaining it highly symmetrical. At the same time a time constant capacitor in a controlling voltage retention circuit is used which can be integrated into the semiconductor chip. Thus the entire AGC control circuit can be integrated into a single semiconductor chip and provide a significantly improved, substantially less distorted result. Consequently an improvement of result, reduced cost and smaller size circuit is achieved.

In accordance with a preferred embodiment of the invention, an automatic gain control circuit is comprised of a voltage divider having a fixed leg and a variable leg connected in series across a signal input, and a non-inverting operational amplifier connected between the voltage divider and an output terminal, the variable leg comprising an MOSFET transistor having its source connected to the fixed leg, the junction of the source and the fixed leg carrying a d.c. voltage applied from the input, means for applying a fixed operating voltage to the drain of the transistor which is equal to the d.c. voltage at quiescence, means for detecting signal peaks from the output of the operational amplifier which are in the same polarity sense as the operating voltage, means for storing the signal peaks with a predetermined time constant, and for applying the stored signal peaks to the gate of the transistor, whereby the transistor is enabled to conduct an input signal in the voltage divider symmetrically in both positive and negative directions.

Figure 2:
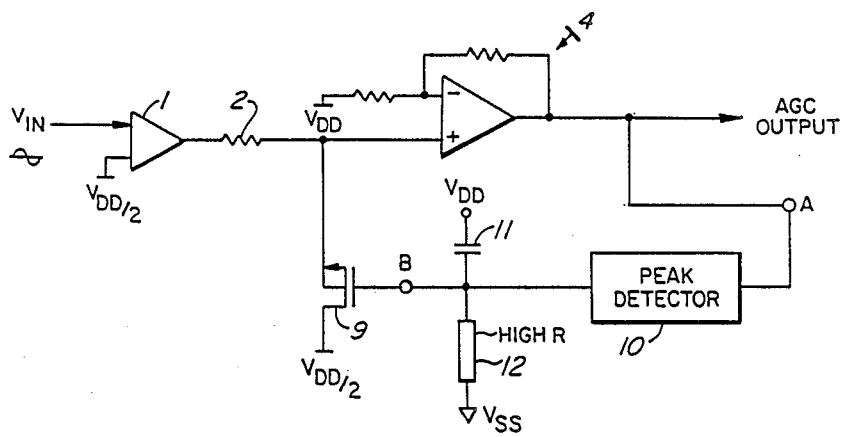
Figure 2A:
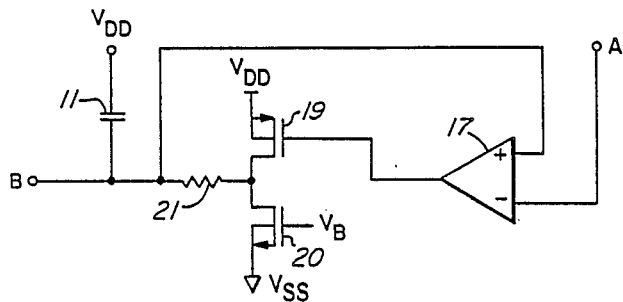
Figure 3:
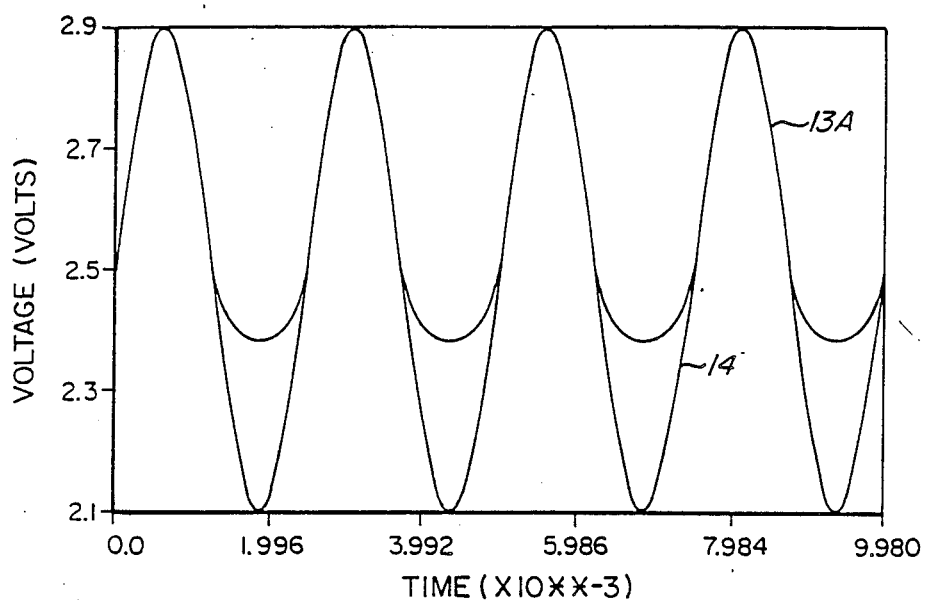
Figure 4:
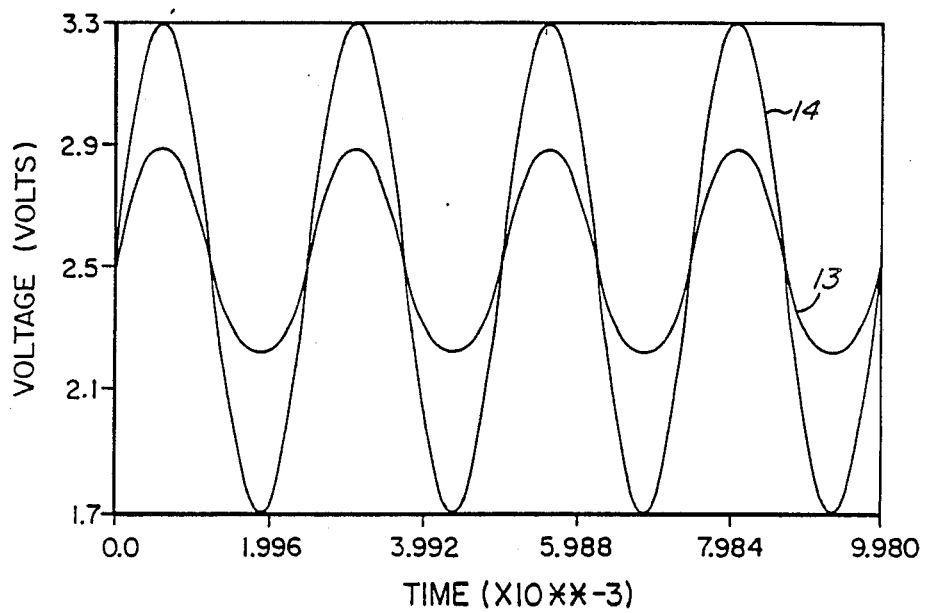
Figure 5:
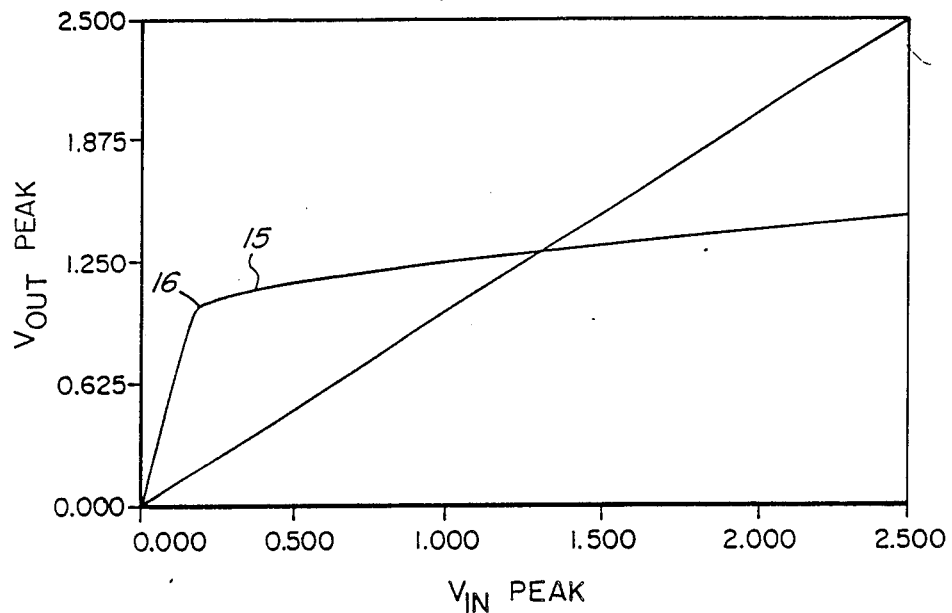

A better understanding of this invention will be obtained by reference to the detailed description below, in conjunction with the following drawings, in which:

FIG. 1 is a partly schematic and partly block diagram illustration of a AGC circuit in accordance with the prior art, FIG. 2 is a partly schematic and partly block diagram illustration of the preferred embodiment of the present invention, FIG. 2A is a detailed schematic diagram of a part of FIG. 2, FIG. 3 illustrates an input signal and an output signal resulting from a prior art AGC circuit, FIG. 4 illustrates an input signal and an AGC output signal resulting from the present invention, and FIG. 5 is a graph of peak output signal vs the peak input signal, illustrating the signal compression achieved by the present invention.

According to a common prior art circuit, as shown in FIG. 1, an input signal $V_{IN}$ is applied to a buffer amplifier 1, which has a second input connected to a terminal of a power supply which supplies operating voltage VDD; a terminal supplying voltage VDD/2 is connected to the second input of the buffer amplifier. This results in the voltage VDD/2 appearing at the output of the buffer amplifier 1 during quiescent conditions.

A voltage divider which is comprised of a resistor 2 and field effect transistor (FET) 3 (usually an N-channel MOSFET) connected in series, has one terminal connected to the output of buffer amplifier 1. The other terminal, that is the source and substrate are connected to the power supply terminal VDD/2. The output of the voltage divider, that is, the junction of the drain of FET 3 and resistor 2 is connected to the input of a non-inverting operational amplifier 4. The output of amplifier 4 is connected to an AGC output lead.

The output signal from amplifier 4 is connected to the input of a high pass filter 5, the output of which is connected to the input of a full wave rectifier 6, the output of which is connected to the input of a peak detector 7. The output of the peak detector 7 is connected to a controlling voltage retention circuit having a predetermined time constant comprised of capacitor 8 which has its other terminal connected to terminal VDD/2. The capacitor is connected to the gate of transistor 3.

In operation, capacitor 8 charges and retains a varying voltage level related to the peaks of the signal having passed through amplifier 4, high pass filtered and full wave rectified. That varying voltage controls the gate to source voltage of transistor 3. Transistor 3 is thus caused to exhibit varying resistance in the source-drain circuit, depending on the gate voltage, causing variation in the ratio of the voltage divider, and thus controlling the amplitude of the output signal to a relatively constant level.

It has been found that there is less compression of the positive-going swings of the input signal voltage $V_N$, and more compression of the negative going swings. The result is an output signal similar to that shown in FIG. 3, measured in one typical prior art circuit. It was noted that the signal is highly distorted. The input signal 14 varies linearly about the 2.500 V.d.c. axis. The output signal varies between 2.5 and 2.9 volts positively and between 2.5 and only about 2.39 volts negatively.

In order to establish the required controlling signal retention time constant for an input signal in the DTMF (audio) range, the capacitor 8 was required to be about 1 microfarad. This required an off-chip (non-integrated) capacitor.

In order to drive transistor 3 as linearly as possible, the feedback loop through the high pass filter, rectifier and peak detector requires gain. The various components and amplifier for providing the gain clearly requires the use of substantial semiconductor substrate area. This requirement, coupled with the need for an off-chip capacitor involves sustantial cost, and results in a circuit which is undesirably large in physical size.

In the preferred embodiment of the present invention as shown in FIG. 2, the input signal $V_N$ is applied to the input of a buffer amplifier 1. The second input to the amplifier 1 is connected to one-half the operating supply voltage, that is, to VDD/2. The output of amplifier 1 is connected to a voltage divider comprised of a fixed leg, formed of resistor 2 in series with a variable resistance leg, formed of field effect transistor 9, which is preferably an N channel MOSFET.

The output of the voltage divider (the junction of the resistor 2 and field effect transistor 9) is connected to non-inverting operational amplifier 4, the output of which is connected to an AGC output lead. In contrast to the prior art, however, the transistor 9 has its source and substrate connected to resistor 2, rather than to the power supply. The drain, in the present case, is connected to the power supply voltage VDD/2. This change in the connection of the transistor with the remaining changes to the circuit, has been found to make a profound difference in effect.

The output signal from amplifier 4 is applied to the input of a peak detector 10. The output of the peak detector is connected to the gate of transistor 9. No high pass filter or full wave rectifier is required as in the prior art.

Connected to the gate of transistor 9 is one terminal of a small preferably MOS capacitor 11, which has its other terminal connected to the power supply voltage VDD. Also connected to the gate of transistor 9 is a terminal of very high resistance 12, which has its other terminal connected to a low voltage or ground, VSS.

Capacitor 11 can be merely 50 picofarads where the AGC circuit is used for DTMF signals, or smaller for higher frequency signals. High resistance 12 can be from one to several gigaohms. In order to form this high resistance a current mirror formed of MOSFETS is preferred to be used. The resulting time constant as between the high resistance and capacitor 11 should be about 50 milliseconds for an AGC circuit for controlling DTMF (audio frequency) signals passing therethrough. It is preferred that the time constant of this circuit should be about 50 times the expected inverse of the frequency at the lowest frequency end of the signal band to be translated by the circuit. Resistor 2 can be doped polysilicon in an integrated circuit.

In operation, during quiescence, the output of buffer amplifier 1, and thus the source terminal of amplifier 9 will be at the voltage VDD/2. The drain of transistor 9 is also fixed to this voltage. Since no signal is detected by peak detector 10 during quiescence, the gate will be at the voltage VSS, which is applied thereto through resistance 12. As a result the source-drain circuit of transistor 9 is nonconductive, and therefore a virtually open circuit.

An input signal is $V_{IN}$ having passed through buffer 1 translated by amplifier 4 until signal peaks at the output of amplifier 4 occur above a predetermined threshold, determined in peak detector 10. Capacitor 11 charges with the peaks, discharging with the time constant of capacitor 11 and resistance 12. With the gate of transistor 9 varying with the voltage stored on capacitor 11, a differential base to source voltage is established, which will be above or below VDD/2 plus the voltage divided input signal amplitude at the source-resistor 2 junction. The result is conduction in the source-drain circuit of transistor 9. The source-drain circuit of transistor 9 exhibits resistor-like characteristics in a well known manner, having a resistance which varies depending on the voltage applied to its gate. The result is a variation in the ratio of the voltage divider formed by resistor 2 and transistor 9.

The peak detector 10 and current mirror 12 can be fabricated using the circuit illustrated in FIG. 2A. The circuit substitutes for the elements between points A and B (the feedback loop) shown in FIG. 2.

The output signal from non-inverting operational amplifier 4 appearing at point A is applied to the inverting input of buffer amplifier 17. The output of operational amplifier 17 is connected to one of a pair of CMOS transistors having their source drain circuits connected in series, and in particular to the gate of P channel MOSFET 19, which has its source connected to the voltage source VDD and its drain to the drain of N channel MOSFET transistor 20. The source N channel MOSFET transistor 20 is connected to voltage terminal VSS. The gate of transistor 20 is connected to a reference voltage source VB.

The junction between the drains of transistors 19 and 20 is connected through resistor 21 to the point B. That point is also connected to one terminal of capacitor 11, whose other terminal is connected to the source of operating voltage VDD. Point B is also connected to the non-inverting input of amplifier 17.

Amplifier 17, transistor 19 and capacitor 11 operate as a positive peak detector. With the terminal B being connected in a feedback circuit to the non-inverting input of (buffer) operational amplifier 17, the resistance which appears from point B to the power supply return path VDD/2 or Vss is extremely high, being several gigaohms. Transistor 20 is a current mirror. Thus the discharge path for capacitor 11 appears as a very high resistance. To obtain a time constant of e.g. 50 milliseconds, capacitor 11 can be so small (typically 50 picofarads) as to be integratable in the same monolithic circuit with the remainder of the elements described above. This contrasts with the external capacitor required in the prior art of about 1 microfarad, which is unrealistic, or impossible to integrate.

It has been found that in the circuit as described above, the AGC output signal is highly linear, as shown by curve 13 in FIG. 4, which is the output signal corresponding to a sine wave input signal 14. In particular, the output signal is very much more linear than the output signal 13A shown in FIG. 3.

The transfer characteristic, curve 15, of the preferred embodiment of the invention is shown in FIG. 5. It may be seen that the output signal Vout Peak relative to the input signal Vin peak displays no compression below the threshold (knee 16), while the output signal relative to the input signal above the knee 16 shows significant, and substantially linear compression.

The circuit described with respect to FIGS. 2 and 2A can be entirely integrated into a semiconductor chip. No external capacitors are required. As a result a significantly less costly, physically smaller and more linear circuit results in comparison to the prior art AGC circuit as described above.

A person understanding this invention may now conceive of alternatives or changes conforming to the principles of the present invention. All are considered to be within the sphere and scope of the invention as defined in the claims appended hereto.

We claim:

1. An automatic gain control circuit comprising:
   a voltage divider having a fixed leg and a variable leg connected in series across a signal input, and a non-inverting operational amplifier connected between the voltage divider and an output terminal, the variable leg comprising an MOSFET transistor having its source connected to the fixed leg, the junction of the source and the fixed leg carrying a d.c. voltage applied from the input, means for applying a fixed operating voltage to the drain of the transistor which is equal to the d.c. voltage, means for detecting signal peaks from the output of the operational amplifier which are in the same polarity sense as the operating voltage, means for storing the signal peaks in a storage means having a predetermined time constant, and for applying the stored signal peaks to the gate of the transistor, whereby the transistor is enabled to conduct an input signal in the voltage divider symmetrically in both positive and negative directions.

2. An automatic gain control circuit as defined in claim 1, in which the transistor is an N-channel MOSFET, the source and transistor substrate are connected together to the fixed leg, the operating voltage is positively poled, and in which the peak detector is adapted to detect positive polarity peaks.

3. An automatic gain control circuit as defined in claim 2 in which the fixed leg of the voltage divider is comprised of resistive means.

4. An automatic gain control circuit as defined in claim 2 in which the means for storing the signal peaks is comprised of a capacitor connected between the output of the detecting means and an operating voltage source which is double the voltage applied to the drain, with a discharge path comprised of a high resistive means connected between another pole of the voltage source and the output of the detecting means.

5. An automatic gain control circuit as defined in claim 2 in which the means for storing the signal peaks is comprised of a capacitor connected between the output of the detecting means and an operating voltage source which is double the voltage applied to the drain, with a discharge path comprised of a high resistive means connected between another pole of the voltage source and the output of the detecting means, and in which the fixed leg of the voltage divider is comprised of resistive means formed of doped polyisilicon.

6. An automatic gain control circuit as defined in claim 2 in which the means for storing the signal peaks is comprised of a capacitor connected between the output of the detecting means and an operating voltage source which is double the voltage applied to the drain, with a discharge path comprised of a high resistive means connected between another pole of the voltage source and the output of the detecting means, and in which the fixed leg of the voltage divider is comprised of resistive means, and further including an input buffer amplifier having one input connected to a voltage source equal to said d.c. voltage, and another input connected for receiving an input signal, and an output connected to the input of the voltage divider for applying said signal and said d.c. voltage thereto.

7. An automatic gain control circuit as defined in claim 2 in which the means for storing the signal peaks is comprised of an MOS capacitor connected between the output of the detecting means and an operating voltage source which is double the voltage applied to the drain, and a discharge path comprised of a current mirror means connected between another pole of the voltage source and the output of the detecting means.

8. An automatic gain control circuit as defined in claim 2 in which the means for storing the signal peaks is comprised of an MOS capacitor connected between the output of the detecting means and an operating voltage source which is double the voltage applied to the drain, and a discharge path comprised of a current mirror means connected between another pole of the voltage source and the output of the detecting means, and in which the fixed leg of the voltage divider is comprised of resistive means.

9. An automatic gain control circuit as defined in claim 2 in which the means for storing the signal peaks is comprised of an MOS capacitor connected between the output of the detecting means and an operating voltage source which is double the voltage applied to the drain, and a discharge path comprised of a current mirror means connected between another pole of the voltage source and the output of the detecting means, and in which the fixed leg of the voltage divider is comprised of resistive means, and further including an input buffer amplifier having an input connected for receiving an input signal, and an output connected to the input of the voltage divider for applying said signal and said d.c. voltage thereto.

10. An automatic gain control circuit as defined in claim 2 in which the means for storing the signal peaks is comprised of a capacitor connected between the output of the detecting means and an operating voltage source which is double the voltage applied to the drain, and a discharge path comprised of a current mirror circuit connected between another pole of the voltage source and the output of the detecting means, and in which the fixed leg of the voltage divider is comprised of resistive means, and further including an input amplifier having an input connected to a voltage source equal to said d.c. voltage, and another input connected for receiving an input signal, and an output connected to the input of the voltage divider for applying said signal and said d.c. voltage thereto.

11. An automatic gain control circuit as defined in claim 2 in which the means for storing the signal peaks is comprised of a capacitor connected between the output of the detecting means and an operating voltage source which is double the voltage applied to the drain, and a discharge path comprised of a current mirror circuit having an effective resistance of several gigaohms connected between another pole of the voltage source and the output of the detecting means, and in which the fixed leg of the voltage divider is comprised of resistive means, and further including an input amplifier having an input connected to a voltage source equal to said d.c. voltage, and another input connected for receiving an input signal, and an output connected to the input of the voltage divider for applying said signal and said d.c. voltage thereto.

12. An automatic gain control circuit as defined in claim 1 in which the fixed leg of the voltage divider is comprised of resistive means.

13. An automatic gain control circuit as defined in claim 1 in which the means for storing the signal peaks is comprised of a capacitor connected between the output of the detecting means and an operating voltage source which is double the voltage applied to the drain, with a discharge path comprised of a high resistive means connected between another pole of the voltage source and the output of the detecting means.

14. An automatic gain control circuit as defined in claim 1 in which the means for storing the signal peaks is comprised of a capacitor connected between the output of the detecting means and an operating voltage source which is double the voltage applied to the drain, with a discharge path comprised of a high resistive means connected between another pole of the voltage source and the output of the detecting means, and in which the fixed leg of the voltage divider is comprised of resistive means formed of doped polyisilicon.

15. An automatic gain control circuit as defined in claim 1 in which the means for storing the signal peaks is comprised of a capacitor connected between the output of the detecting means and an operating voltage source which is double the voltage applied to the drain, with a discharge path comprised of a high resistive means connected between another pole of the voltage source and the output of the detecting means, and in which the fixed leg of the voltage divider is comprised of resistive means, and further including an input buffer amplifier having one input connected to a voltage source equal to said d.c. voltage, and another input connected for receiving an input signal, and an output connected to the input of the voltage divider for applying said signal and said d.c. voltage thereto.

16. An automatic gain control circuit as defined in claim 1 in which the means for storing the signal peaks is comprised of an MOS capacitor connected between the output of the detecting means and an operating voltage source which is double the voltage applied to the drain, and a discharge path comprised of a current mirror means connected between another pole of the voltage source and the output of the detecting means.

17. An automatic gain control circuit as defined in claim 1 in which the means for storing the signal peaks is comprised of an MOS capacitor connected between the output of the detecting means and an operating voltage source which is double the voltage applied to the drain, and a discharge path comprised of a current mirror means connected between another pole of the voltage source and the output of the detecting means, and in which the fixed leg of the voltage divider is comprised of resistive means.

18. An automatic gain control circuit as defined in claim 1 in which the means for storing the signal peaks is comprised of an MOS capacitor connected between the output of the detecting means and an operating voltage source which is double the voltage applied to the drain, and a discharge path comprised of a current mirror means connected between another pole of the voltage source and the output of the detecting means, and in which the fixed leg of the voltage divider is comprised of resistive means, and further including an input buffer amplifier having an input connected for receiving an input signal, and an output connected to the input of the voltage divider for applying said signal and said d.c. voltage thereto.

19. An automatic gain control circuit as defined in claim 1 in which the means for storing the signal peaks is comprised of a capacitor connected between the output of the detecting means and an operating voltage source which is double the voltage applied to the drain, and a discharge path comprised of a current mirror circuit connected between another pole of the voltage source and the output of the detecting means, and in which the fixed leg of the voltage divider is comprised of resistive means, and further including an input amplifier having an input connected to a voltage source equal to said d.c. voltage, and another input connected for receiving an input signal, and an output connected to the input of the voltage divider for applying said signal and said d.c. voltage thereto.

20. An automatic gain control circuit as defined in claim 19 in which the resistive means, input amplifier, operational amplifier, means for detecting signal peaks, capacitor, and current mirror circuit are fabricated as a monolithic integrated circuit.

21. An automatic gain control circuit as defined in claim 1 in which the means for storing the signal peaks is comprised of a capacitor connected between the output of the detecting means and an operating voltage source which is double the voltage applied to the drain, and a discharge path comprised of a current mirror circuit having an effective resistance of several gigaohms connected between another pole of the voltage source and the output of the detecting means, and in which the fixed leg of the voltage divider is comprised of resistive means, and further including an input amplifier having an input connected to a voltage source equal to said d.c. voltage, and another input connected for receiving an input signal, and an output connected to the input of the voltage divider for applying said signal and said d.c. voltage thereto.

22. An automatic gain control circuit as defined in claim 21 in which the resistive means, input amplifier, operational amplifier, means for detecting signal peaks, capacitor, and current mirror circuit are fabricated as a monolithic integrated circuit.

23. An automatic gain control circuit comprising:
(a) means for receiving an input signal,
(b) means for providing operating power supply positive voltage VDD and reduced or opposite polarity voltage VSS,
(c) a voltage divider for the input signal connected to the receiving means comprised of
  (i) a fixed resistive means having one terminal connected to the receiving means,
  (ii) an N-channel MOSFET transistor having a source terminal and substrate connected to the other terminal of the resistance means, a drain connected to the voltage source of about one half the supply voltage (VDD/2), and a gate,
(d) means for applying one half the supply voltage (VDD/2) to the input of the voltage divider,
(e) a non-inverting operational amplifier circuit connected to the junction of the fixed resistance means and the source terminal, and having an AGC output terminal,
(f) a positive signal peak detector having its input connected to the output terminal of the operational amplifier, and its output connected to the gate,
(g) a charge storing integrated circuit capacitor connected between the gate and the positive voltage supply VDD,
(h) and a current mirror connected between the gate and the reduced or opposite supply voltage VSS,
the time constant of the capacitor and current mirror being about 50 milliseconds,
whereby an input signal carried by the voltage divider is compressed by variation in the resistance of the source-drain circuit of the MOSFET transistor upon variation in its gate-source voltage due to the difference in voltage across the capacitor and the function of the source and fixed resistive means.

24. An automatic gain control circuit as defined in claim 23, in which said means for receiving an input signal is comprised of a buffer amplifier connected to the power supply providing means for applying one half the operating voltage VDD to the fixed resistive means.

* * * * *